United States Patent
Lee

(10) Patent No.: US 7,260,006 B2
(45) Date of Patent: Aug. 21, 2007

(54) BITLINE DRIVING CIRCUIT IN SEMICONDUCTOR MEMORY DEVICE AND DRIVING METHOD THEREOF

(75) Inventor: Jong-Won Lee, Ichon (KR)

(73) Assignee: Hynix Semiconductor Inc. (KR)

(*) Notice: Subject to any disclaimer, the term of this patent is extended or adjusted under 35 U.S.C. 154(b) by 3 days.

(21) Appl. No.: 11/311,273

(22) Filed: Dec. 20, 2005

(65) Prior Publication Data

US 2006/0215479 A1   Sep. 28, 2006

(30) Foreign Application Priority Data

Mar. 24, 2005 (KR) .................. 10-2005-0024509

(51) Int. Cl.
*G11C 7/00* (2006.01)
(52) U.S. Cl. ..................... 365/203; 365/205
(58) Field of Classification Search ............. 365/203, 365/205, 207, 222
See application file for complete search history.

(56) References Cited

U.S. PATENT DOCUMENTS

| | | | |
|---|---|---|---|
| 5,995,434 A | 11/1999 | Ryu | |
| 5,999,471 A | 12/1999 | Choi | |
| 6,038,186 A | 3/2000 | Tanizaki | |
| 6,154,400 A * | 11/2000 | Wang et al. | 365/203 |
| 6,434,065 B1 * | 8/2002 | Kobayashi et al. | 365/200 |
| 6,473,348 B2 * | 10/2002 | Sim | 365/205 |
| 6,483,765 B2 | 11/2002 | Han | |

FOREIGN PATENT DOCUMENTS

JP   09-063266   3/1997

* cited by examiner

*Primary Examiner*—Anh Phung
(74) *Attorney, Agent, or Firm*—McDermott Will & Emery LLP

(57) ABSTRACT

There is provided a bitline driving circuit and its driving method for minimizing a leakage current flowing between a wordline and a bitline in a power down mode and a self-refresh mode. The bitline driving circuit for reducing a leakage current in a semiconductor memory device includes a main driving block for precharging a bitline pair connected to a sense amplifier with a same voltage level, controlled by a main bitline equalizing signal; a sub driving block for equalizing a voltage level of a bitline pair connected to a cell array voltage in a precharge mode, controlled by a sub bitline equalizing signal; and a bitline isolation block for electrically disconnecting the main driving block and the sub driving block, controlled by a bitline isolation signal.

16 Claims, 7 Drawing Sheets

BITLINE DRIVING CIRCUIT IN SEMICONDUCTOR MEMORY DEVICE AND DRIVING METHOD THEREOF

FIELD OF THE INVENTION

The present invention relates to a semiconductor memory device; and more particularly, to a bitline driving circuit in a semiconductor memory device and its driving method for minimizing a leakage current flowing between a wordline and a bitline in a power down mode and a self-refresh mode.

DESCRIPTION OF RELATED ART

FIG. 1 is a block diagram of a conventional semiconductor memory device.

Referring to FIG. 1, the conventional semiconductor memory device 1 includes a control signal input terminal 10 for receiving a control signal such as a column address strobe (CAS) bar signal/CAS, a row address strobe (RAS) bar signal/RAS, a write enable bar signal/WE and an output enable bar signal/OE or the like, an address input terminal 12 for receiving address signals A1 to An where n is a positive integer, and a data input terminal 14 for transferring input/output data DQ1 to DQi where i is a positive integer.

The conventional semiconductor memory device 1 further includes a control circuit 20, a memory cell array 30, an address buffer 35, a row decoder 40, a column decoder 45, a sense amplifier circuit 50, an input/output circuit 60, an input buffer 70, and an output buffer 75.

The control circuit 20 controls whole the operations of the semiconductor memory device 1 in response to the control signal inputted to the control signal input terminal 10.

The memory cell array 30 is provided with a plurality of memory cells arranged in a matrix shape. A wordline is allocated in every row and a bitline is allocated in every column in the memory cell array so that each of the memory cells is arranged at every intersection of the wordline and the bitline.

The address buffer 35 supplies the address signal inputted from an exterior to the row decoder 40 and the column decoder 45, selectively. The row decoder 40 drives at least one wordline among the plurality of the wordlines in response to the row address signal supplied from the address buffer 35. The column decoder 45 drives at least one bitline among the plurality of the bitlines in response to the column address signal supplied from the address buffer 35. The sense amplifier circuit 50 incorporates therein a plurality of sense amplifiers. One sense amplifier is provided for every two bitline pair so as to amplify a voltage difference generated between the bitline pairs.

The input/output circuit 60 supplies a voltage level of the bitline pair selected by the column decoder 45 to the output buffer 75. The output buffer 75 amplifies the supplied voltage level so as to output it as the output data DQ1 to DQi to an exterior. The input buffer 70 amplifies the input data DQ1 to DQi when the input data DQ1 to DQi is supplied from an exterior. The input/output circuit 60 receives an amplified input data DQ1 to DQi and supplies then to the bitline pair selected by the column decoder 45.

As the semiconductor memory device becomes highly integrated and employs a micronized process, there are many difficulties in configuring each pattern on the device. One of the difficulties is a bridge phenomenon between the wordline and the bitline, which incurs a leakage current flowing between the wordline and the bitline. Although there occurs a defect, the semiconductor memory device has relief circuits therein to replace the corresponding wordline and the bitline by the other circuits, to thereby enable the semiconductor memory device to perform a normal operation. However, though the normal operation is enabled in this case, there still exists the leakage current.

FIG. 2 is a circuit diagram setting forth a conventional sense amplifier circuit, and FIG. 3 is a timing diagram of a sense amplifier control signal according to the conventional sense amplifier circuit.

(1) In Active Mode (ACT)

In case that an upper wordline WL_up is enabled in an active mode (ACT), a bitline isolation high signal BISH becomes in logic high level and a bitline isolation low signal BISL becomes in logic low level, so that a sense amplifier Sense Amp amplifies a data of an upper cell cell_up connected to the upper wordline WL_up.

Similarly, in case that a lower wordline WL_down is enabled, the bitline isolation high signal BISH becomes in logic low level and the bitline isolation low signal BISL becomes in logic high level, so that the sense amplifier Sense Amp amplifies a data of a lower cell cell_down connected to the lower wordline $WL_{13}$ down.

(2) In Precharge Mode (PRE)

The bitline isolation high signal BISH and the bitline isolation low signal BISL for isolating each cell cell_up and cell_down from the sense amplifier Sense Amp keep in logic high levels in a precharge mode. In addition, a bitline equalizing signal BLEQ for applying a voltage with the same level to a bitline pair BL and BLB keeps in logic high level. Thus, the bitline pair BL and BLB maintains a predetermined voltage level, i.e., Vcore/2.

Meanwhile, though there exists the leakage current Ileak flowing between the wordline and the bitline during the active mode, the amount of the leakage current Ileak is too small in comparison with total amount of active current. However, the bitline pair BL and BLB keeps the predetermined voltage level of Vcore/2 in a standby mode, i.e., the precharge mode in which the bitline equalizing signal BLEQ is in logic high level as depicted as time periods of a, b and c in FIG. 3. In this case, the wordline maintains a ground voltage level. Therefore, there occurs a current path from one of the bitline pair BL and BLB to the wordline if there is any error in the process.

However, as demands for mobile devices have been increased in company with demands for a high integration of the semiconductor device, the amount of current needed in the power down mode and the self-refresh mode becomes an important issue. That is, since the semiconductor memory device for the mobile device requires a predetermined current for the power down or the self-refresh of which the amount of current is about one-tenth of the current required for the normal semiconductor memory device, the leakage current flowing between the wordline and the bitline becomes a quite amount of current, which can not be neglected, in the semiconductor memory device for the mobile devices. Therefore, it is very important to reduce this leakage current.

SUMMARY OF THE INVENTION

It is, therefore, an object of the present invention to provide a bitline driving circuit and its driving method for minimizing a leakage current flowing between a wordline and a bitline in a power down mode and a self-refresh mode of a semiconductor memory device.

In accordance with an aspect of the present invention, there is provided a bitline driving circuit including: a main driving block for precharging a bitline pair connected to a sense amplifier with a same voltage level, controlled by a main bitline equalizing signal; a sub driving block for equalizing a voltage level of a bitline pair connected to a cell array voltage in a precharge mode, controlled by a sub bitline equalizing signal; and a bitline isolation block for electrically disconnecting the main driving block and the sub driving block, controlled by a bitline isolation signal.

In accordance with another aspect of the present invention, there is provided a method for driving a bitline, including the steps of: precharging a bitline pair connected to a sense amplifier with a same voltage level in a power down mode or a self-refresh mode, controlled by a main bitline equalizing signal; applying the same voltage level to a bitline pair connected to a cell array in a precharge mode, controlled by a sub bitline equalizing signal; and electrically disconnecting the bitline pair connected to the sense amplifier and the bitline pair connected to the cell array, controlled by a bitline isolation signal.

In accordance with further another aspect of the present invention, there is provided a semiconductor memory device, configured with a plurality of cell array blocks and a plurality of sense amplifiers for amplifying a readout data from the plurality of the cell array blocks, the bitline circuit including: a sub driving block for equalizing a voltage level of a bitline pair connected to the plurality of cell array blocks in a precharge mode, controlled by a sub bitline equalizing signal; a bitline isolation block for electrically disconnecting the main driving block and the sub driving block, controlled by a bitline isolation signal, wherein the sub driving block in the other cell array block among the plurality of the cell array blocks except the cell array block selected for a refresh operation is turned off so that the bitline pair is electrically isolated from cells of the other cell array block in the self-refresh mode, controlled by the sub bitline equalizing signal.

In accordance with still further another aspect of the present invention, there is provided a method for driving a bitline in a semiconductor memory device, the semiconductor memory device being configured with a plurality of cell array blocks and a plurality of sense amplifiers for amplifying a readout data from the plurality of the cell array blocks, the method including the steps of: precharging a bitline pair connected to a sense amplifier to a same voltage level in a self-refresh mode, controlled by a main bitline equalizing signal; turning off the sub driving block in the other cell array block among the plurality of the cell array blocks except the cell array block selected for a refresh operation, wherein the sub driving block is controlled by a sub bitline equalizing signal in the self-refresh mode; and c) electrically disconnecting the bitline pair and a cell in the other cell array block, controlled by a bitline isolation signal.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

Other objects and aspects of the invention will become apparent from the following description of the embodiments with reference to the accompanying drawings, which is set forth hereinafter.

Figure 4:
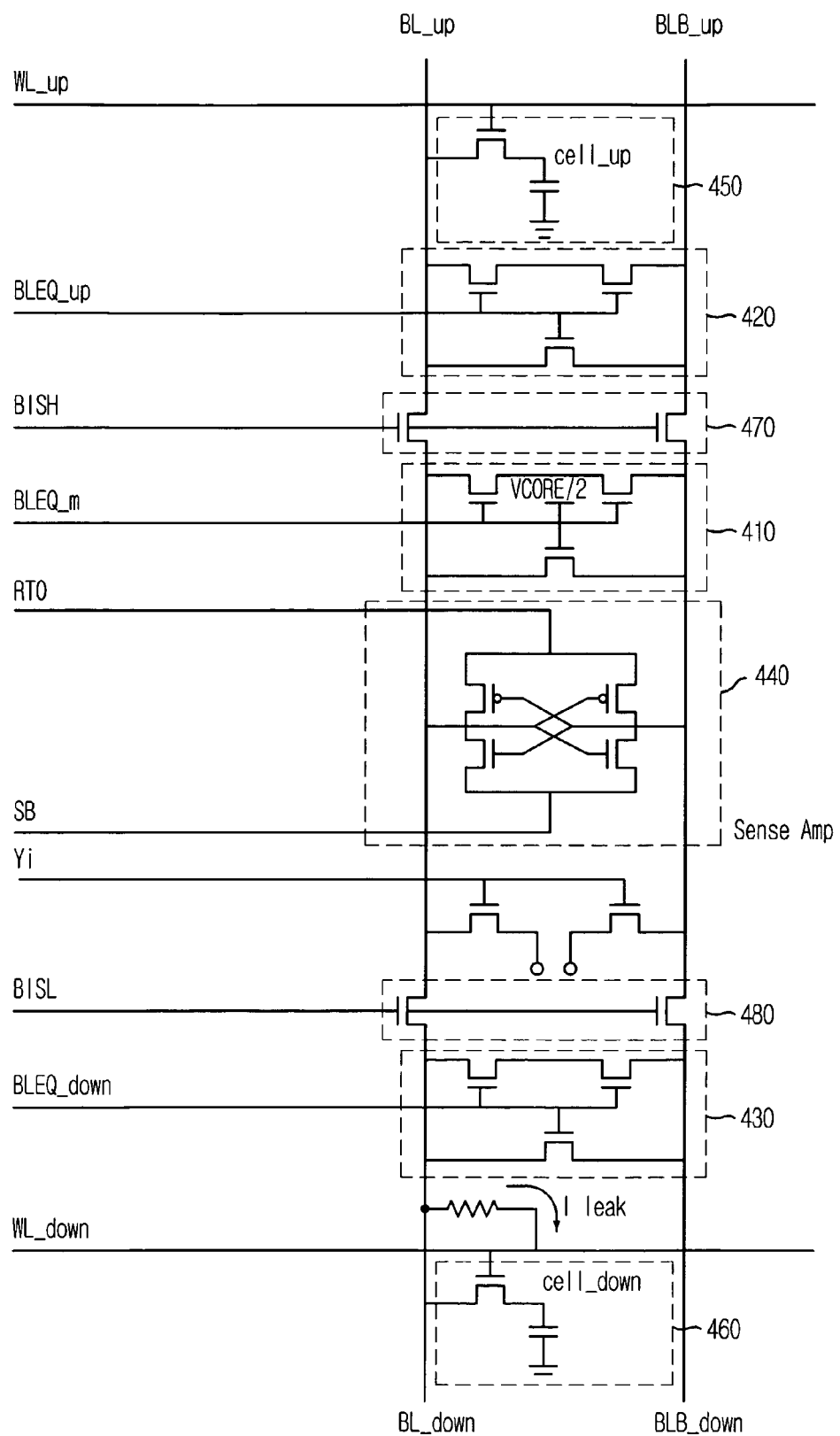
FIG. 4 is a circuit diagram of a sense amplifier circuit in accordance with an embodiment of the present invention.

FIG. 4 is a circuit diagram of a sense amplifier circuit in accordance with the present invention.

Referring to FIG. 4, a sense amplifier of the present invention includes a main bitline equalizer 410 and sub bitline equalizers 420 and 430.

The main bitline equalizer 410 is controlled by a main line equalizing signal BLEQ_m enabled in a power down mode or a self-refresh mode, as similar to the prior art, so as to precharge a bitline pair BL and BLB connected to the sense amplifier, to a Vcore/2 voltage.

The sub bitline equalizers 420 and 430 are controlled by sub bitline equalizing signals BLEQ_up and BLEQ_down which are disabled in the power down mode so as not to apply the Vcore/2 voltage to the bitline pair BL and BLB. Meanwhile, in order to prevent data loss caused by the leakage current in the self-refresh mode, an active operation and a precharge operation are periodically performed for each cell in a block. Therefore, this is similarly applied to a sub bitline equalizer in the other blocks except the selected block for refresh in the self-refresh mode.

A first and a second bitline isolation units 470 and 480 are controlled in coincidence with the sub bitline equalizers 420 and 430 respectively, and electrically isolate the main bitline equalizer 410 from an upper and a lower cells cell_up and cell$_{13}$ down. This is similarly applied to a first and a second bitline isolation unit in the other blocks except the selected block for refresh in the self-refresh mode.

However, the bitline pair BL and BLB should not only be in a floating state but also keep the Vcore/2 voltage, in order that the cell data may be normally amplified at the sense amplifier when the wordline is enabled.

Therefore, it is preferable that whole the bitline pairs BL and BLB in the semiconductor memory device should be precharged to the Vcore/2 voltage by turning on the sub bitline equalizers 420 and 430 and the first and the second bitline isolation units 470 and 480 in case of exiting from a precharge power down mode.

Furthermore, in accordance with the embodiment of the present invention, the bitline pair BL and BLB is precharged for every unit block in the self-refresh mode. That is, the bitline equalizer that the refresh operation is not performed is turned off, whereas the bitline equalizer that the refresh operation is performed is turned on.

Figure 5:
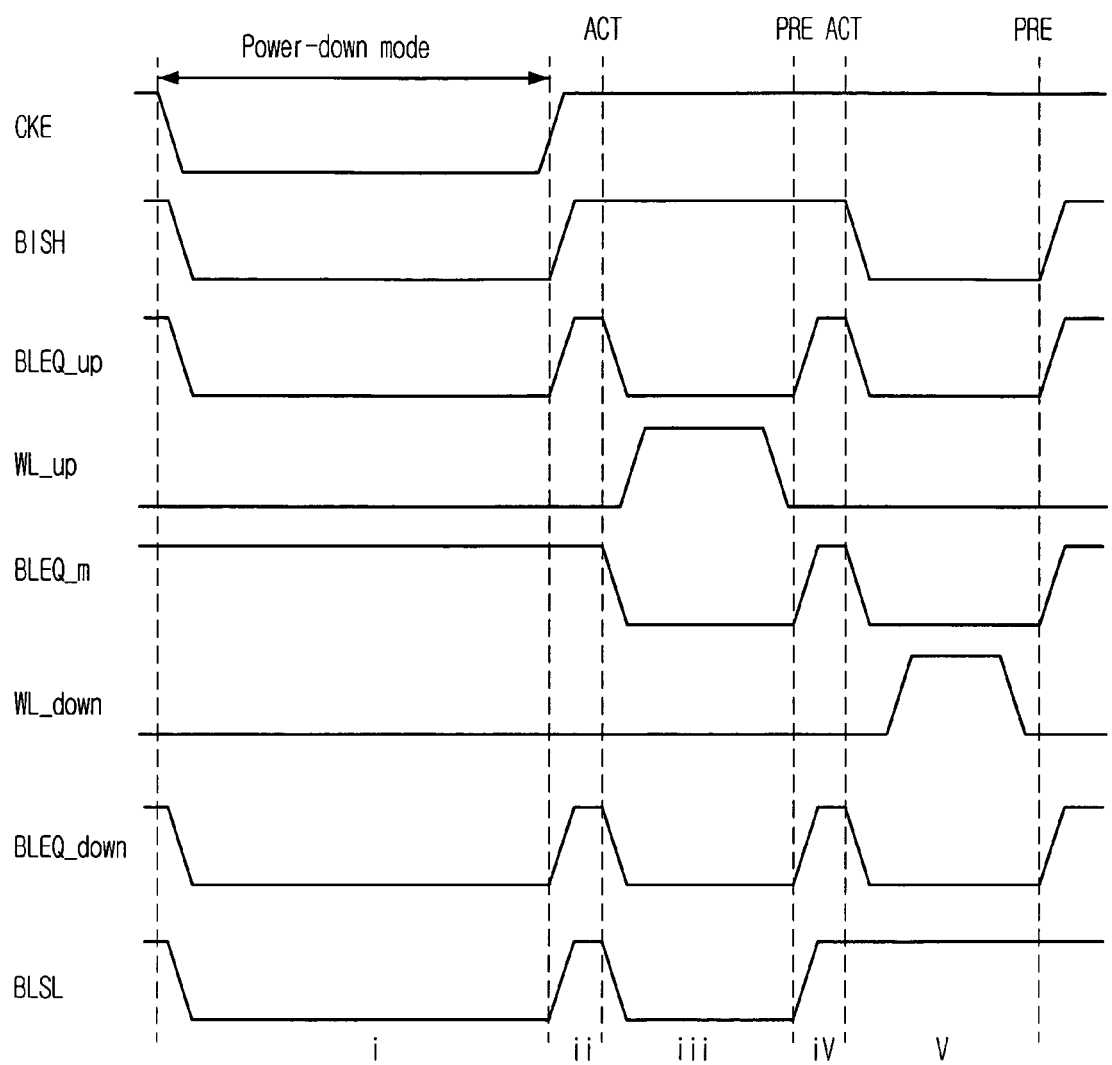
FIG. 5 is a timing diagram of a sense amplifier control signal of FIG. 4.

FIG. 5 is a timing diagram of a sense amplifier control signal of FIG. 4.

The power down mode shown in FIG. 5 is a case of entering the power down mode from the precharge mode and the case of exiting from the power down mode.

(1) i Period

When the clock enable signal CKE is transited to a logic low level from a high level to enter the precharge power down mode, the first and the second bitline isolation signals BISH and BISL are transited to logic low levels from high levels to be disabled. As a result, an upper bitline pair $BL\_up$ and $BLB\_up$ and a lower bitline pair $BL\_down$ and $BLB\_down$ are isolated from the sense amplifier. The sub bitline equalizing signals $BLEQ\_up$ and $BLEQ\_down$ are transited to logic low levels from high levels to be disabled, which results in turning off the sub bitline equalizers 420 and 430 so that it is possible to prevent the leakage current flowing between the bitline pair and the wordline pair.

At this time, the main bitline equalizing signal $BLEQ_{13}$ m still keeps in logic high level as similar as the normal precharge mode, to maintain the bitline pair connected to the sense amplifier to have the Vcore/2 voltage.

(2) ii Period

In case of exiting from the precharge power down mode, the semiconductor memory device can be precharged by controlling the clock enable signal CKE without a precharge command.

(3) iii Period

The first bitline isolation signal BISH keeps in logic high level to turn on the first bitline isolation unit 470, and the second bitline isolation signal BISL is transited to a logic low level to turn off the second bitline isolation unit 480, to thereby readout the data of the upper cell cell_up.

(4) iv Period

The main and the sub bitline equalizers 410, 420 and 430 are wholly enabled in the precharge operation to precharge the bitline pair BL and BLB to the Vcore/2 rapidly.

(5) v Period

The first bitline isolation signal BISH is transited to a logic low level to turn off the first bitline isolation unit 470, and the second bitline isolation signal BISL keeps in logic high level to turn on the second bitline isolation unit 480, to thereby readout the data of the lower cell cell_down.

Figure 6:
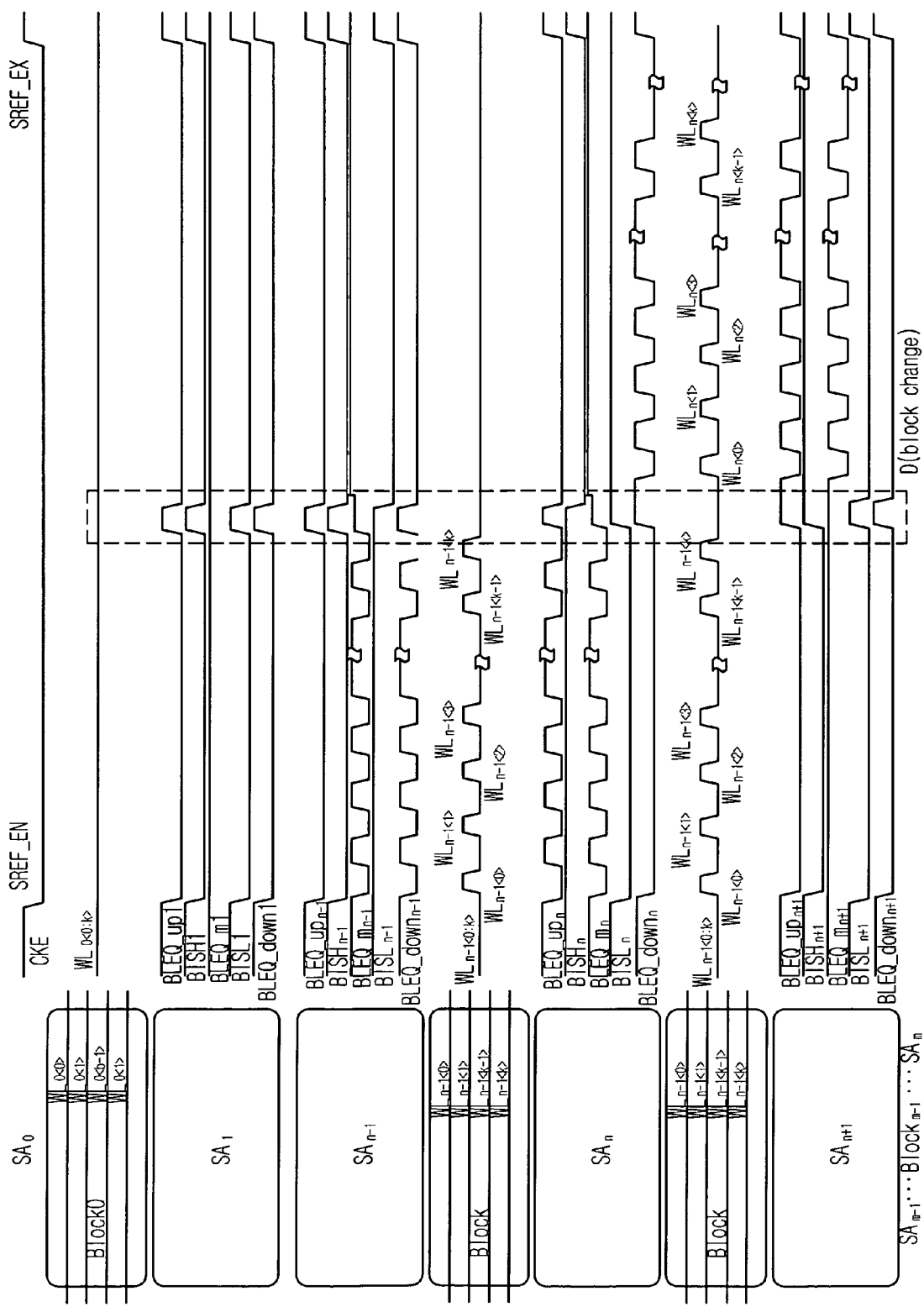
FIG. 6 is a timing diagram illustrating a control operation of a plurality of sense amplifiers in a self-refresh mode in accordance with the embodiment of the present invention.

FIG. 6 is a timing diagram illustrating a control operation of a plurality of sense amplifiers in a self-refresh mode in accordance with the embodiment of the present invention.

Referring to FIG. 6, the sub bitline equalizing signals BLEQ_up and BLEQ_down and the first and the second bitline isolation signals BISH and BISL, which do not perform the refresh operation, are disabled. On the contrary, the sub bitline equalizing signals BLEQ_up and BLEQ_down and the first and the second bitline isolation signals BISH and BISL, which perform the refresh operation, are enabled.

In accordance with another embodiment of the present invention, after the wordline enabling operation is completed to a last wordline in the block where the refresh operation is performed, the refresh operation for a next block begins to be performed. In particular, in case that the refresh operation for the next block is followed by the refresh operation for a previous block, the sense amplifier and the bitline pairs in all the banks are precharged by using a block selection address signal, which is denoted as a 'D' region in FIG. 6.

Figure 7:
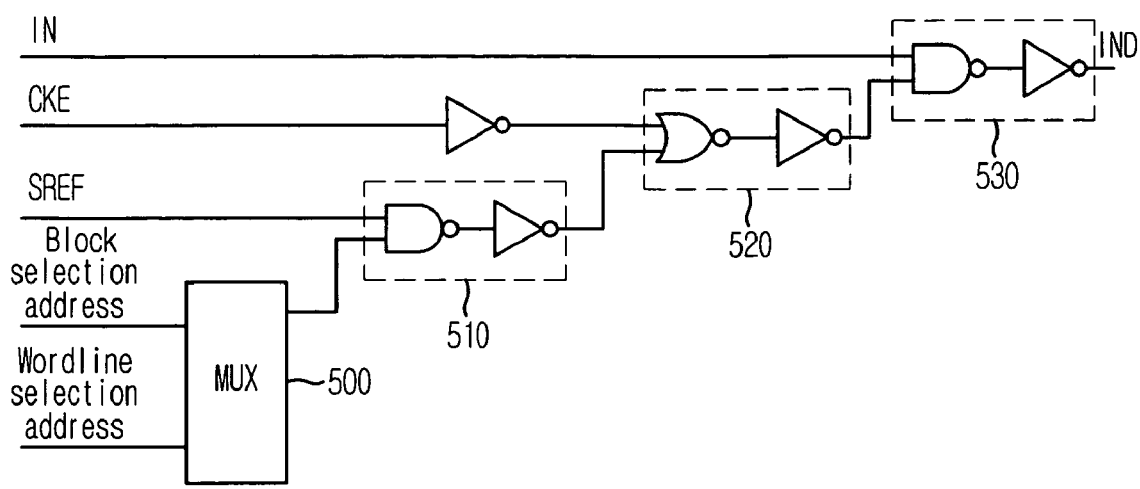
FIG. 7 is a circuit diagram of a control signal generator in accordance with the embodiment of the present invention.

FIG. 7 is a circuit diagram of a control signal generator in accordance with the embodiment of the present invention.

Figure 1:
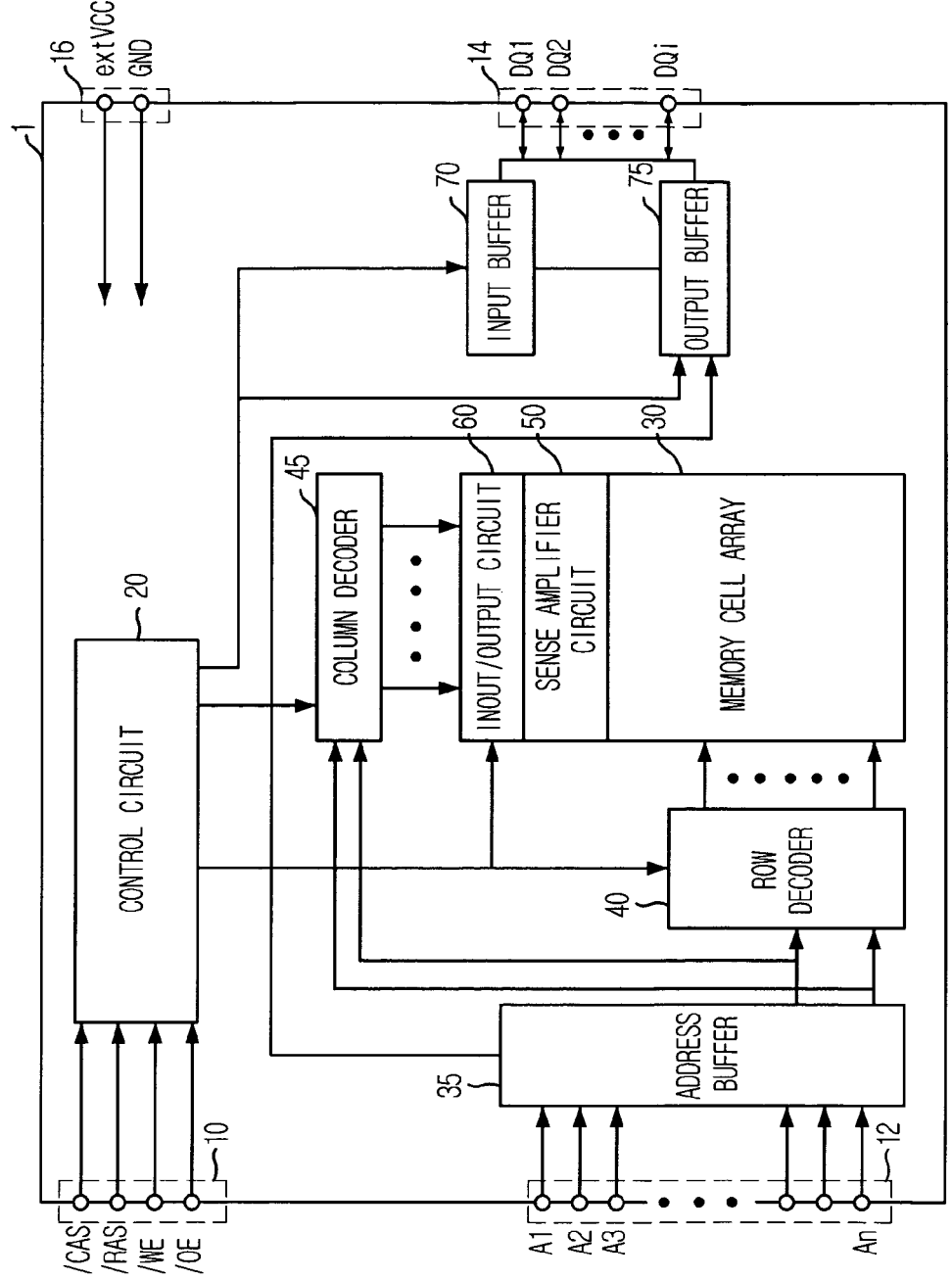
FIG. 1 is a block diagram of a conventional semiconductor memory device.
Figure 2:
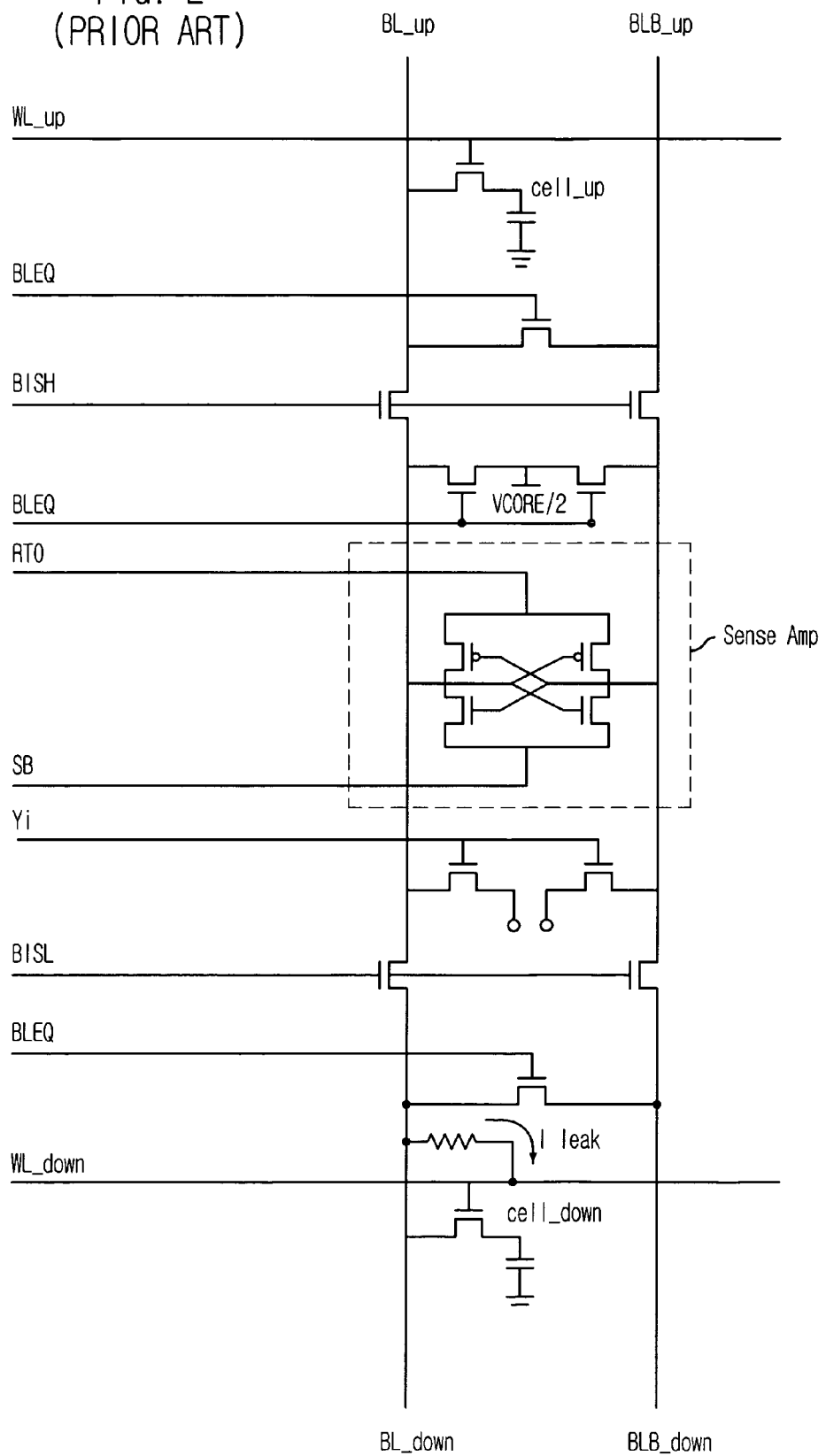
FIG. 2 is a circuit diagram of a conventional sense amplifier circuit.
Figure 3:
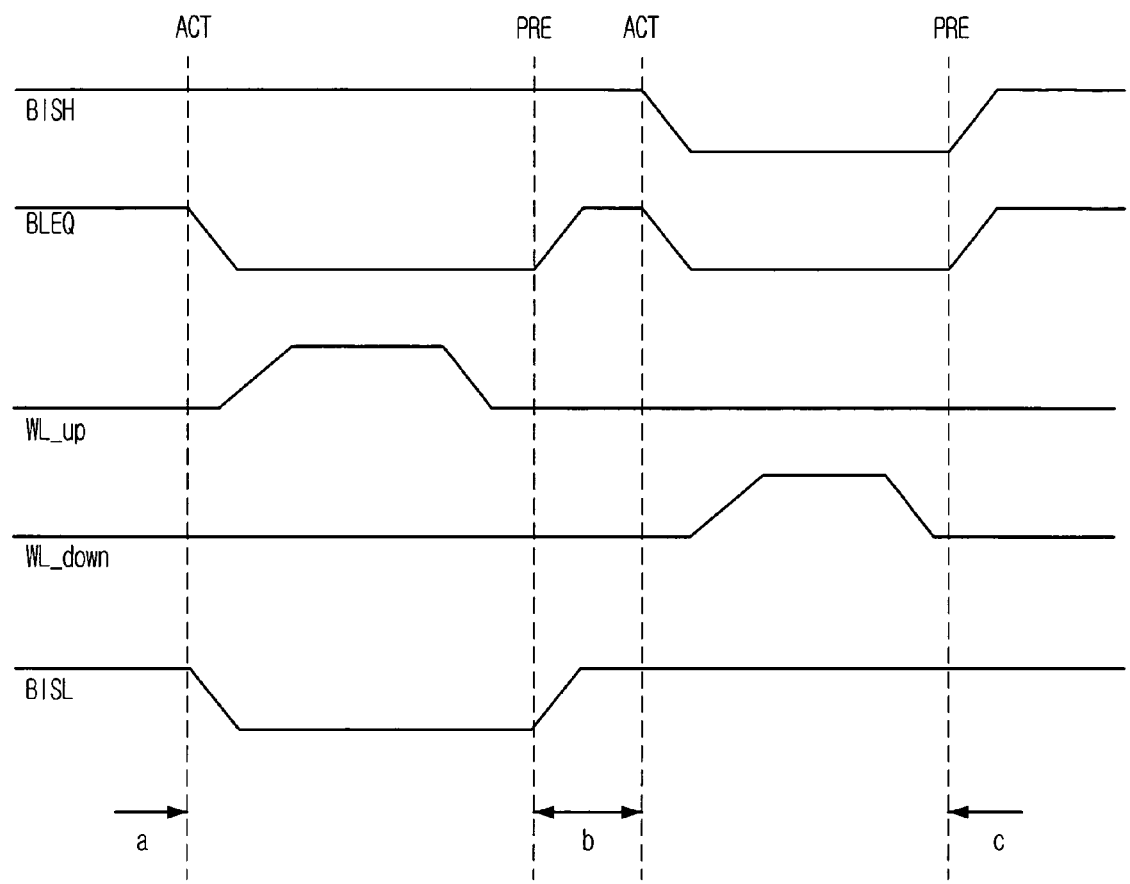
FIG. 3 is a timing diagram of a sense amplifier control signal according to the conventional sense amplifier circuit.

Referring to FIG. 7, the control signal generator in accordance with the embodiment of the present invention, which is located in the control circuit of FIG. 1, may generate a control signal IND required at the 'D' region of FIG. 6.

The control signal generator is provided with a multiplexer 500 for generating an output signal after a last wordline of a predetermined block is selected by receiving the block selection address signal and a wordline selection address signal, a first AND gate 510 for performing a logic AND operation to a self-refresh mode signal SREF and the output of the multiplexer 500, an OR gate 520 for performing a logic OR operation to a clock enable signal CKE and an output of the first AND gate, and a second AND gate 530 for performing a logic AND operation to the sub bit equalizing signal and an output of the OR gate 520.

Herein, detail descriptions for each signal will be set forth as followings. An in signal of FIG. 7 may be the sub bitline equalizing signals BLEQ_up and BLEQ_down or the first and the second bitline isolation signals BISH and BISL generated in accordance with the embodiment of the present invention. The clock enable signal CKE is for embodying the precharge power down mode operation and an exit operation for the self-refresh mode. The self-refresh mode signal SREF is a signal having information with regard to the self-refresh mode. The multiplexer 500 generates the output signal after the last wordline of the predetermined block is selected by using the block selection address signal and the wordline selection address signal within a bank. That is, after the last wordline of the predetermined block is selected, all the blocks are precharged.

In accordance with the present invention, it is possible to minimize the leakage current flowing between the wordline and the bitline in a standby mode.

The present application contains subject matter related to Korean patent application No. 2005-24509, filed in the Korean Intellectual Property Office on Mar. 24, 2005, the entire contents of which is incorporated herein by reference.

While the present invention has been described with respect to certain preferred embodiments, it will be apparent to those skilled in the art that various changes and modifications may be made without departing from the scope of the invention as defined in the following claims.

What is claimed is:

1. A bitline driving circuit for reducing a leakage current in a semiconductor memory device, comprising:
   a main driving block for precharging a bitline pair connected to a sense amplifier with a same voltage level, controlled by a main bitline equalizing signal;
   a sub driving block for equalizing a voltage level of a bitline pair connected to a cell array in a precharge mode, controlled by a sub bitline equalizing signal; and
   a bitline isolation block for electrically disconnecting the main driving block and the sub driving block, controlled by a bitline isolation signal.

2. The bitline driving circuit of claim 1, wherein the main driving block precharges the bitline pair connected to the sense amplifier with the same voltage level in a power down mode or a self-refresh mode.

3. The bitline driving circuit of claim 2, wherein the sub driving block is turned off in the power down mode, controlled by the sub bitline equalizing signal.

4. The bitline driving circuit of claim 3, wherein the bitline isolation signal is synchronized with the sub bitline equalizing signal.

5. The bitline driving circuit of claim 4, wherein the bitline isolation block includes:
   a first bitline isolation block for electrically disconnecting the main driving block and an upper cell storing a data, controlled by a first bitline isolation signal; and
   a second bitline isolation block for electrically disconnecting the main driving block and a lower cell storing a data, controlled by a second bitline isolation signal.

6. The bitline driving circuit of claim 5, wherein the sub driving block includes:

a first sub driving block for electrically being connected to an upper bitline pair according to an operation of the first bitline isolation unit; and a second sub driving block for electrically being connected to a lower bitline pair according to an operation of the second bitline isolation unit.

7. A method for driving a bitline, comprising the steps of:
a) precharging a bitline pair connected to a sense amplifier with a same voltage level in a power down mode or a self-refresh mode, controlled by a main bitline equalizing signal;
b) applying the same voltage level to a bitline pair connected to a cell array in a precharge mode, controlled by a sub bitline equalizing signal; and
c) electrically disconnecting the bitline pair connected to the sense amplifier and the bitline pair connected to the cell array, controlled by a bitline isolation signal.

8. The method of claim 7, the step b) further comprising the step of being turned off in the power down mode, controlled by the sub bitline equalizing signal.

9. The method of claim 8, wherein the bitline isolation signal is synchronized with the sub bitline equalizing signal.

10. The method of claim 9, wherein the step b) includes the steps of:
b1) applying the voltage of the same level to a bitline pair connected to an upper cell based on a first bitline isolation signal of the bitline isolation signal; and
b2) applying the voltage of the same level to a bitline pair connected to a lower cell based on a second bitline isolation signal of the bitline isolation signal.

11. A semiconductor memory device, configured with a plurality of cell array blocks and a plurality of sense amplifiers for amplifying a readout data from the plurality of the cell array blocks for reducing a leakage current in the semiconductor memory device, comprising:
a main driving block for precharging a bitline pair connected to the plurality of the sense amplifiers with a same voltage level, controlled by a main bitline equalizing signal; and
a sub driving block for equalizing a voltage level of a bitline pair connected to the plurality of cell array blocks in a precharge mode, controlled by a sub bitline equalizing signal;
a bitline isolation block for electrically disconnecting the main driving block and the sub driving block, controlled by a bitline isolation signal,
wherein the sub driving block in the other cell array block among the plurality of the cell array blocks except the cell array block selected for a refresh operation is turned off so that the bitline pair is electrically isolated from cells of the other cell array block in the self-refresh mode, controlled by the sub bitline equalizing signal.

12. The bitline circuit of claim 11, further comprising a control signal generating unit for outputting a control signal to precharge whole the plurality of the cell array blocks, before the refresh operation is performed for a next cell array block, after the selected cell array block is refreshed in the self-refresh mode.

13. The bitline driving circuit of claim 12, wherein the control signal generating unit includes:
a multiplexer for generating an output signal after a last wordline of a predetermined block is selected by receiving a block selection address signal and a wordline selection address signal;
a first AND gate for performing a logic AND operation to a self-refresh mode signal and an output of the multiplexer;
an OR gate for performing a logic OR operation to a clock enable signal and an output of the first AND gate; and
a second AND gate for performing a logic AND operation to the sub bit equalizing signal and an output of the OR gate.

14. A method for driving a bitline in a semiconductor memory device, the semiconductor memory device being configured with a plurality of cell array blocks and a plurality of sense amplifiers for amplifying a readout data from the plurality of the cell array blocks for reducing a leakage current in the semiconductor memory device, comprising the steps of:
a) precharging a bitline pair connected to a sense amplifier to a same voltage level in a self-refresh mode, controlled by a main bitline equalizing signal;
b) turning off the sub driving block in the other cell array block among the plurality of the cell array blocks except the cell array block selected for a refresh operation, wherein the sub driving block is controlled by a sub bitline equalizing signal in the self-refresh mode; and
c) electrically disconnecting the bitline pair and a cell in the other cell array block, controlled by a bitline isolation signal.

15. The method of claim 14, wherein the bitline isolation signal is synchronized with the sub bitline equalizing signal.

16. The method of claim 15, further comprising the step of precharging whole the plurality of the cell array blocks, before the refresh operation is performed for a next cell array block, after the selected cell array block is refreshed in the self-refresh mode.

* * * * *